(12) United States Patent
Suzuki

(10) Patent No.: US 6,794,120 B2
(45) Date of Patent: Sep. 21, 2004

(54) METHOD OF PROCESSING LIGHT SENSITIVE PLANOGRAPHIC PRINTING PLATE PRECURSOR

(75) Inventor: Toshitsugu Suzuki, Hachioji (JP)

(73) Assignee: Konica Corporation, Tokyo (JP)

(*) Notice: Subject to any disclaimer, the term of this patent is extended or adjusted under 35 U.S.C. 154(b) by 0 days.

(21) Appl. No.: 10/443,940

(22) Filed: May 22, 2003

(65) Prior Publication Data

US 2004/0131974 A1 Jul. 8, 2004

(30) Foreign Application Priority Data

May 29, 2002 (JP) .............................. 2002-155386

(51) Int. Cl.$^7$ .............................................. G03F 7/30
(52) U.S. Cl. ................................... 430/322; 430/325
(58) Field of Search ............................... 430/322, 325

(56) References Cited

U.S. PATENT DOCUMENTS 4,334,003 A * 6/1982 Jones ......................... 430/156

2002/0148822 A1 * 10/2002 Nozawa et al. ............. 219/216

* cited by examiner

Primary Examiner—Hoa Van Le
(74) Attorney, Agent, or Firm—Frishauf, Holtz, Goodman & Chick, P.C.

(57) ABSTRACT

Disclosed is a method of processing a light sensitive planographic printing plate precursor comprising a support, and provided thereon, a photopolymerizable light sensitive layer and an overcoat layer in that order, the method comprising the steps of imagewise exposing the light sensitive planographic printing plate precursor, pre-washing the exposed light sensitive planographic printing plate precursor with washing water, and developing the pre-washed light sensitive planographic printing plate precursor with a developer containing an alkali metal-containing compound, wherein the pre-washing step comprises first washing the exposed light sensitive planographic printing plate precursor with a first water being water which has been used at least one time for washing the exposed light sensitive planographic printing plate precursor, and then washing the resulting precursor with a second water being fresh water which has not been used before for washing the exposed light sensitive planographic printing plate precursor.

14 Claims, 1 Drawing Sheet

FIG. 1

METHOD OF PROCESSING LIGHT SENSITIVE PLANOGRAPHIC PRINTING PLATE PRECURSOR

FIELD OF THE INVENTION

The present invention relates to a method of processing a light sensitive printing plate precursor, and particular to a method of processing a light sensitive printing plate precursor, which can reduce sludge produced during processing and provide a printing plate preventing staining occurring at non-image portions.

BACKGROUND OF THE INVENTION

A light sensitive planographic printing plate precursor (hereinafter referred to also as a printing plate precursor) is known which comprises a support subjected to hydrophilization treatment and provided thereon, a photopolymerizable layer and a protective layer. Recently, in order to obtain a printing plate with high resolution image in a short time or to carry out a direct plate making system, a method has been applied in which a planographic printing plate precursor is digitally exposed based on image information employing laser rays, and developed with a developer to prepare a printing plate.

As one embodiment, there is a system preparing a planographic printing plate in which a light sensitive planographic printing plate precursor is scanning-exposed employing a light source modulated with an image signal transmitted by communication lines or output signals from an electronic plate making system or an image processing system.

Generally, a photopolymerizable layer contains an acryl monomer, an alkali soluble resin, a photo-initiator, and optionally a sensitizing dye to absorb a range of wavelengths of emitted light (particularly laser light).

As a light source for exposing a photopolymerization type light sensitive planographic printing plate precursor is used a visible light source having a longer wavelength such as an Ar laser (488 nm) or an FD-YAG laser (532 nm). In recent years, semiconductor lasers employing, for example, InGaN type material, which can continuously emit light with a wavelength of from 380 to 430 nm, are about to be put into practical use. A scanning exposure system employing light with such a short wavelength as a light source has advantages in providing sufficient output power and an economical system, since the semiconductor lasers can be structurally manufactured at low cost. Further, a planographic printing plate precursor to be applied to the above light source has a spectral sensitivity shorter than that of a planographic printing plate precursor to be applied to a system employing a conventional FD-YAG laser or Ar laser, and therefore, operation under safe light is easy.

A photopolymerization type light sensitive planographic printing plate precursor is imagewise exposed, optionally heated, washed with water (in order to remove a protective layer), developed with a developer to remove unexposed portions, washed with water, and post-processed with a finisher or a gumming solution to make non-image portions hydrophilic. Thus, a printing plate is obtained.

As a support of the light sensitive planographic printing plate precursor, one having high hydrophilicity, high water retention property, and excellent adhesion to the light sensitive layer is desired, and an aluminum plate whose surface is subjected to graining for roughness is generally used.

A light sensitive planographic printing plate precursor with high sensitivity reduces the time required for exposure, and can shorten the time necessary to prepare a printing plate. When printing is carried out employing a printing plate obtained from such a planographic printing plate precursor, printing is often suspended on account of registering or a break. When printing, after suspended, is resumed, minute stain spots (hereinafter referred to as peppering) may occur at the non-image portions of the printing plate. In order to prevent occurrence of the peppering, a method has been desired which maintains hydrophilicity of the non-image portions of the printing plate.

As a developer for a light sensitive planographic printing plate precursor, an aqueous solution of an alkali metal silicate is generally used, and the alkali metal silicate reacts with the aluminum plate support to increase hydrophilicity of the aluminum plate support surface. However, this method cannot sufficiently maintain hydrophilicity of the plate surface, and cannot completely prevent occurrence of the peppering.

A photopolymerization type light sensitive planographic printing plate precursor has high sensitivity, and can provide a printing plate in a short processing time. However, it has been found that when the photopolymerization type light sensitive planographic printing plate precursor is repeatedly developed with a developer replenished with a developer replenisher, employing an automatic developing machine, components in the photopolymerizable layer of the printing plate precursor are eluted into the developer, and then precipitate. The photopolymerization type light sensitive planographic printing plate precursor, which forms a latent image due to free radical reaction, has high sensitivity, but has drawback in that the free radical reaction is inhibited by oxygen. As a countermeasure, it is well known that it is effective to provide an oxygen-shielding layer on the photopolymerizable light sensitive layer, and to incorporate polyvinyl alcohol as a main component in the oxygen-shielding layer. However, when a light sensitive planographic printing plate precursor comprising polyvinyl alcohol as a main component is repeatedly developed with a developer replenished with a developer replenisher, employing an automatic developing machine, it has been found that an agar-like gel is produced in the developer of the developer tank of the automatic developing machine, resulting in development faults. Therefore, a developer, which reduces occurrence of sludge occurrence and lightens cleaning load of the developer tank, has been sought.

Pre-washing before development can prevent incorporation of the oxygen-shielding layer components into the developer. However, when washing water is used in the pre-washing step and discarded without being reused, a large amount of washing water is required, and when washing water is used while circulated as a water saving measure, washing water in the pre-washing step is gradually polluted, resulting in reduction of the detergent function.

SUMMARY OF THE INVENTION

The present invention has been made in view of the above. An object of the invention is to provide a light sensitive planographic printing plate precursor processing method of providing a planographic printing plate which prevents peppering from occurring at non-image portions of the printing plate, when printing is started employing the printing plate, suspended on account of registering or a break, and then resumed. Another object of the invention is to provide a light sensitive planographic printing plate precursor processing method of reducing sludge produced in a developing tank during processing and lightening cleaning load of the developer tank.

DETAILED DESCRIPTION OF THE INVENTION

The above objects of the invention can be attained by the followings:

1-1. A method of processing a light sensitive planographic printing plate precursor containing a support, and provided thereon, a photopolymerizable light sensitive layer and an overcoat layer in that order, the photopolymerizable light sensitive layer containing a compound having an ethylenic addition polymerizable group, a photo-initiator and a polymer binder, the method comprising the steps of imagewise exposing the light sensitive planographic printing plate precursor, pre-washing the exposed light sensitive planographic printing plate precursor with washing water, and developing the pre-washed light sensitive planographic printing plate precursor with a developer containing an alkali metal-containing compound, wherein the pre-washing step comprises first washing the exposed light sensitive planographic printing plate precursor with a first water being water which has been used at least one time for washing the exposed light sensitive planographic printing plate precursor, and then washing the resulting precursor with a second water being fresh water which has not been used before for washing the exposed light sensitive planographic printing plate precursor.

1-2. The method of item 1-1 above, further comprising the step of post-washing the developed light sensitive planographic printing plate precursor with post-washing water, wherein the post-washing water comprises a part of washing water used in the pre-washing step.

1-3. The method of item 1-1 above, wherein the first water is re-circulated and supplied onto the surface of the printing plate precursor through a spray, and the second water is supplied onto the surface of the printing plate precursor through a spray.

1-4. The method of item 1-3 above, wherein the amount of the first water to be supplied onto the surface of the printing plate precursor is from 0.5 to 20 liters per $m^2$ of the printing plate precursor, and the second water is supplied onto the surface of the printing plate precursor from 0.5 to 3 liters per $m^2$ of the printing plate precursor.

1-5. The method of item 1-1 above, wherein in the pre-washing step the second water is replenished with all of the second water, which has been used for washing the light sensitive planographic printing plate precursor.

1-6. The method of item 1-1 above, wherein the method further comprises the step of rubbing the surface of the first washed light sensitive planographic printing plate precursor with a brush between the first water washing step and the second water washing step.

1-7. The method of item 1-1 above, wherein the temperature of the first water and the second water is from 15 to 65° C.

1-8. The method of item 1-1 above, wherein the overcoat layer contains polyvinyl alcohol or polyvinyl pyrrolidone.

1-9. The method of item 1-1 above, wherein the alkali metal containing compound is potassium silicate, sodium silicate, lithium silicate, potassium metasilicate, sodium metasilicate, lithium metasilicate, potassium phosphate, sodium phosphate, lithium phosphate, potassium hydrogenphosphate, sodium hydrogenphosphate, lithium hydrogenphosphate, potassium carbonate, sodium carbonate, lithium carbonate, potassium hydrogen carbonate, sodium hydrogen carbonate, lithium hydrogen carbonate, potassium borate, sodium borate, or lithium borate.

1-10. The method of item 1-9 above, wherein the alkali metal containing compound is potassium silicate or sodium silicate.

1-11. The method of item 1-10 above, wherein the concentration of silicate in the developer is from 1.0 to 3.0% by weight in terms of $SiO_2$ concentration.

1-12. The method of item 1-1 above, wherein the pH of the developer is from more than 8.5 to less than 13.0.

1-13. The method of item 1-1 above, wherein the developer further contains a weak acid having an acid dissociation constant of from 10.0 to 13.2.

1-14. The method of item 1-1 above, wherein in the pre-washing step the second water is tap water.

2-1. A method of processing a light sensitive planographic printing plate precursor containing a support, and provided thereon, a photopolymerizable light sensitive layer and an overcoat layer in that order, the photopolymerizable light sensitive layer containing a compound having an ethylenic addition polymerizable group, a photo-initiator and a polymer binder, the method comprising the steps of imagewise exposing the light sensitive planographic printing plate precursor, pre-washing the exposed light sensitive planographic printing plate precursor with washing water, and developing the pre-washed light sensitive planographic printing plate precursor with a developer containing an alkali metal-containing compound, wherein in the pre-washing step the exposed light sensitive planographic printing plate precursor is first washed with water which has been used at least one time for washing, and then washed with fresh water which has not substantially been used for washing.

2-2. The method of item 2-1 above, further comprising the step of post-washing the developed light sensitive planographic printing plate precursor with post-washing water, wherein the post-washing water comprises a part of washing water used in the pre-washing step.

The present invention will be explained in detail below.

Support

Examples of a support used in the light sensitive planographic printing plate precursor in the invention include a plate of a metal such as aluminum, stainless steel, chromium, or nickel, a plastic film such as a polyester film, a polyethylene film or a polypropylene film which is deposited or laminated with the above-described metal, and a polyester film, a polyvinyl chloride film or a nylon film whose surface is subjected to hydrophilization treatment. Among the above, the aluminum plate is preferably used, and may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron.

It is preferable that the support is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support.

The surface roughening methods include a mechanical surface roughening method and an electro-chemical surface roughening method. The electro-chemical surface roughening is carried out preferably in an acidic medium, and may be used in combination with the mechanical surface roughening.

Though there is no restriction for the electro-chemical surface roughening method, a method in which the support is electrolytically surface roughened in an acidic medium or an acidic electrolytic solution is preferred. Though an acidic electrolytic solution generally used for the electrochemical surface roughening can be used, it is preferable to use an electrolytic solution of hydrochloric acid or that of nitric acid. The electrochemical surface roughening method disclosed in Japanese Patent Publication No. 48-28123, British Patent No. 896,563 and Japanese Patent O.P.I. Publication No. 53-67507 can be used. In the electrolytic surface roughening method, voltage applied is generally from 1 to 50 V, and preferably from 10 to 30 V. The current density used can be selected from the range from 10 to 200 A/dm$^2$, and is preferably from 50 to 150 A/dm$^2$. The quantity of electricity can be selected from the range of from 100 to 5000 C/dm$^2$, and is preferably 100 to 2000 C/dm$^2$. The temperature during the electrolytically surface roughening may be in the range of from 10 to 50° C., and is preferably from 15 to 45° C.

When the support is electro-chemically surface roughened by using an electrolytic solution of nitric acid, voltage applied is generally from 1 to 50 V, and preferably from 5 to 30 V. The current density used can be selected from the range from 10 to 200 A/dm$^2$, and is preferably from 20 to 100 A/dm$^2$. The quantity of electricity can be selected from the range of from 100 to 5000 C/dm$^2$, and is preferably 100 to 2000 C/dm$^2$. The temperature during the electro-chemical surface roughening may be in the range of from 10 to 50° C., and is preferably from 15 to 45° C. The nitric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

When the support is electro-chemically surface roughened by using an electrolytic solution of hydrochloric acid, voltage applied is generally from 1 to 50 V, and preferably from 2 to 30 V. The current density used can be selected from the range from 10 to 200 A/dm$^2$, and is preferably from 50 to 150 A/dm$^2$. The quantity of electricity can be selected from the range of from 100 to 5000 C/dm$^2$, and is preferably 100 to 2000 C/dm$^2$. The temperature during the electrochemical surface roughening may be in the range of from 10 to 50° C., and is preferably from 15 to 45° C. The hydrochloric acid concentration in the electrolytic solution is preferably from 0.1% by weight to 5% by weight. Nitrates, chlorides, amines, aldehydes, phosphoric acid, boric acid, acetic acid or oxalic acid can be added to the electrolytic solution.

After the support has been electro-chemically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 g/m$^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

Though there is no restriction for the mechanical surface roughening method, a brushing roughening method and a honing roughening method are preferable. The brushing roughening method is carried out by rubbing the surface of the support with a rotating brush with a brush hair with a diameter of 0.2 to 0.8 mm, while supplying slurry in which volcanic ash particles with a particle size of 10 to 100 μm are dispersed in water to the surface of the support. The honing roughening method is carried out by ejecting obliquely slurry with pressure applied from nozzles to the surface of the support, the slurry containing volcanic ash particles with a particle size of 10 to 100 μm dispersed in water. A surface roughening can be also carried out by laminating a support surface with a sheet on the surface of which abrading particles with a particle size of from 10 to 100 μm was coated at intervals of 100 to 200 μm and at a density of $2.5 \times 10^3$ to $10 \times 10^3$/cm$^2$, and applying pressure to the sheet to transfer the roughened pattern of the sheet and roughen the surface of the support.

After the support has been roughened mechanically, it is preferably dipped in an acid or an aqueous alkali solution in order to remove abrasives and aluminum dust, etc. which have been embedded in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium hydroxide is preferably used. The dissolution amount of aluminum in the support surface is preferably 0.5 to 5 g/m$^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

After the surface roughening, anodizing treatment may be carried out. There is no restriction in particular for the method of anodizing treatment used in the invention, and known methods can be used. The anodizing treatment forms an anodization film on the surface of the support. For the anodizing treatment there is preferably used a method of applying a current density of from 1 to 10 A/dm$^2$ to an aqueous solution containing sulfuric acid and/or phosphoric acid in a concentration of from 10 to 50%, as an electrolytic solution. However, it is also possible to use a method of applying a high current density to sulfuric acid as described in U.S. Pat. No. 1,412,768, a method to electrolytically etching the support in phosphoric acid as described in U.S. Pat. No. 3,511,661, or a method of employing a solution containing two or more kinds of chromic acid, oxalic acid, malonic acid, etc. The coated amount of the formed anodization film is suitably 1 to 50 mg/dm$^2$, and preferably 10 to 40 mg/dm$^2$. The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water.

The support which has been subjected to anodizing treatment is optionally subjected to sealing treatment. For the sealing treatment, it is possible to use known methods using hot water, boiling water, steam, a sodium silicate solution, an aqueous dichromate solution, a nitrite solution and an ammonium acetate solution.

<Photopolymerizable Light Sensitive Layer>

Ethylenic Addition Polymerizable Group-containing Compound

In the invention, the photopolymerizable light sensitive layer (hereinafter also referred to also as light sensitive layer) of the light sensitive planographic printing plate precursor contains an ethylenic addition polymerizable group-containing compound. The ethylenic addition polymerizable group-containing compound is preferably an ethylenically unsaturated bond-containing monomer.

As the ethylenic addition polymerizable group-containing compound in the invention, the known monomer (hereinafter referred to also as monomer) can be used. Examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate. An oligomer of the above compounds can be also used.

Further, a prepolymer from the above compound can be used, and examples of the prepolymer include compounds as described later. The prepolymer with a photopolymerizable property, which is obtained by incorporating acrylic acid or methacrylic in an oligomer with an appropriate molecular weight, can be suitably employed. This prepolymer can be used singly, as an admixture of the above described monomers and/or oligomers.

Examples of the prepolymer include polyester (meth) acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A.epichlorhydrin.(meth)acrylic acid or phenol novolak.epichlorhydrin.(meth)acrylic acid obtained by incorporating (meth)acrylic acid in an epoxy resin; an urethaneacrylate such as ethylene glycol.adipic acid.tolylenediisocyanate.2-hydroxyethylacrylate, polyethylene glycol.tolylenediisocyanate.2-hydroxyethylacrylate, hydroxyethylphthalyl methacrylate.xylenediisocyanate, 1,2-polybutadieneglycol.tolylenediisocyanate.2-hydroxyethylacrylate or trimethylolpropane.propylene glycol.tolylenediisocyanate.2-hydroxyethylacrylate, obtained by incorporating (meth)acrylic acid in an urethane resin; a silicone acrylate such as polysiloxane acrylate, or polysiloxane.diisocyanate.2-hydroxyethylacrylate; an alkyd modified acrylate obtained by incorporating a methacroyl group in an oil modified alkyd resin; and a spiran resin acrylate.

The light sensitive layer in the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The ethylenic monomer preferably used in the invention is preferably a phosphate compound having at least one (meth)acryloyl group. The phosphate compound is a compound having a (meth)acryloyl group in which at least one hydroxyl group of phosphoric acid is esterified, and the phosphate compound is not limited as long as it has a (meth)acryloyl group.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV.EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

Polymer Binder

In the light sensitive planographic printing plate precursor of the invention, the light sensitive layer and overcoat layer (protective layer or oxygen-shielding layer) contains a polymer binder.

As the polymer binder can be used a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof.

As the polymer binder, a vinyl copolymer obtained by copolymerization of an acryl monomer is preferred. The copolymer is preferably a copolymer containing both (a) a carboxyl group-containing monomer unit and (b) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

As the polymer binder in the invention, a copolymer can be used which contains, as another monomer unit, a monomer unit derived from the monomer described in the following items (1) through (14):

(1) A monomer having an aromatic hydroxy group, for example, o-, (p- or m-) hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl)acrylamide, or N-(p-toluenesulfonyl)-methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine, (13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further, as the polymer binder in the invention, a copolymer can be used which contains, as still another monomer unit, a monomer unit derived from further another monomer capable of being copolymerized with the above monomer.

As the polymer binder is also preferred an unsaturated bond-containing copolymer which is obtained by reacting a carboxyl group contained in the vinyl copolymer molecule with for example, a compound having a (meth)acryloyl group and an epoxy group. Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication No. 11-27196.

The weight average molecular weight of the above copolymer is preferably 10,000 to 200,000 measured by gel permeation chromatography (GPC), but is not limited thereto.

The content of the polymer binder in the photopolymerizable light sensitive layer is preferably from 10 to 90% by weight, more preferably from 15 to 70% by weight, and still more preferably from 20 to 50% by weight in view of sensitivity. The addition amount of the vinyl copolymer is preferably from 50 to 100% by weight based on the total addition amount of the polymer binder.

The acid value of the polymer binder is preferably from 10 to 150, more preferably from 30 to 120, and still more preferably from 50 to 90, in view of balance of polarity of the light sensitive layer, which can prevent coagulation of pigment used in the light sensitive layer coating liquid.

Photopolymerization Initiator

In the invention, the photopolymerizable light sensitive layer of the light sensitive planographic printing plate precursor of the invention contains a polymerization initiator.

Examples of the photopolymerization initiator include carbonyl compounds, organic sulfur compounds, peroxides, redox compounds, azo or diazo compounds, halides and photo-reducing dyes disclosed in J. Kosar, "Light Sensitive Systems", Paragraph 5. The examples thereof are disclosed in British Patent No. 1,459,563.

Examples of the photopolymerization initiator used will be listed below.

A benzoin derivative such as benzoin methyl ether, benzoin i-propyl ether, or $\alpha,\alpha$-dimethoxy-$\alpha$-phenylacetophenone; a benzophenone derivative such as benzophenone, 2,4-dichlorobenzophenone, o-benzoyl methyl benzoate, or 4,4'-bis (dimethylamino) benzophenone; a thioxanthone derivative such as 2-chlorothioxanthone, 2-i-propylthioxanthone; an anthraquinone derivative such as 2-chloroanthraquinone or 2-methylanthraquinone; an acridone derivative such as N-methylacridone or N-butylacridone; $\alpha,\alpha$-diethoxyacetophenone; benzil; fluorenone; xanthone; an uranyl compound; a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85-277 (1988) and Japanese Patent O.P.I. Publication No. 2-182701; 2,4,5-triarylimidazol dimmer disclosed in Japanese Patent O.P.I. Publication No. 3-209477; carbon tetrabromide; and organic halide compounds disclosed in Japanese Patent O.P.I. Publication No. 59-107344.

Of these, titanocenes are preferred. Examples of the titanocenes include di-cyclopentadienyl-Ti-dichloride, dicyclopentadienyl-Ti-bisphenyl, dicyclopentadienyl-Ti-bis-2,3,4,5,6-pentafluorophenyl, dicyclopentadienyl-Ti-bis-2,3,5,6-tetrafluorophenyl, dicyclopentadienyl-Ti-bis-2,4,6-trifluorophenyl, dicyclopentadienyl-Ti-bis-2,6-difluorophenyl, dicyclopentadienyl-Ti-bis-2,4-difluorophenyl, di-methylcyclopentadienyl-Ti-bis-2,3,4,5,6-pentafluorophenyl, di-methylcyclopentadienyl-Ti-bis-2,3,5,6-tetrafluorophenyl, di-methylcyclopentadienyl-Ti-bis-2,4-difluorophenyl, and bis (cyclopentadienyl)-bis (2,6-difluoro-3-(pyrryl)phenyl) titanium (IRUGACURE 784, produced by Ciba Specialty Co., Ltd.), but are not limited thereto.

Sensitizing Dye

In the invention, the photopolymerizable light sensitive layer of the light sensitive planographic printing plate precursor in the invention preferably contains a sensitizing dye.

Examples of the sensitizing dyes, which can induce sensitivity to the wavelengths of the visible and near infrared regions, include cyanines, phthalocyanines, merocyanines, porphyrins, spiro compounds, ferrocenes, fluorenes, fulgides, imidazoles, perylenes, phenazines, phenothiazines, polyenes, azo compounds, diphenylmethanes, triphenylmethanes, polymethine acridines, cumarines, ketocumarines, quinacridones, indigos, styryl dyes, pyrylium dyes, pyrromethene dyes, pyrazolotriazole compounds, benzothiazole compounds, barbituric acid derivatives, thiobarbituric acid derivatives, and compounds disclosed in European Patent No. 568,993, U.S. Pat. Nos. 4,508,811 and 5,227,227, and Japanese Patent O.P.I. Publication Nos. 2001-125255 and 11-271969.

Of these dyes, a pyrromethene compound is especially preferred, and examples of the pyrromethene compound include those disclosed in Japanese Patent O.P.I. Publication No. 11-271969.

The content of the photopolymerization initiator in the light sensitive layer is not specifically limited, but is 0.1 to 20 parts by weight based on 100 parts by weight of the compound having an addition polymerizable group. The content ratio of the photopolymerization initiator to the sensitizing dye in the light sensitive layer of the light sensitive planographic printing plate precursor is preferably from 1:100 to 100:1 by mol.

The photopolymerizable light sensitive layer in the invention has a dry thickness of preferably from 0.1 to 5 $g/m^2$, and more preferably from 0.5 to 3 $g/m^2$.

Overcoat Layer

An overcoat layer (hereinafter referred to also as protective layer or oxygen shielding layer), which is a layer farthest from the support, is preferably provided on the photopolymerizable light sensitive layer of the light sensitive planographic printing plate precursor.

The overcoat layer preferably contains a water soluble polymer capable of forming a layer with low oxygen permeability. Polyvinyl alcohol or polyvinyl pyrrolidone is preferably used. Polyvinyl alcohol has the effect of preventing oxygen from permeating and polyvinyl pyrrolidone has the effect of increasing adhesion between the overcoat layer and the light sensitive layer adjacent thereto.

Besides the above two polymers, the oxygen shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

In the light sensitive planographic printing plate precursor of the invention, adhesive strength between the oxygen shielding layer and the light sensitive layer is preferably not less than 35 mN/mm, and more preferably not less than 75 mN/mm. Preferred composition of the protective layer is disclosed in Japanese Patent Application No. 8-161645.

The adhesive strength in the invention can be measured according to the following procedure.

When an adhesive tape with sufficient adhesive strength having a predetermined width is adhered onto the overcoat layer, and then peeled at an angle of 90° to the plane of the light sensitive planographic printing plate precursor, strength necessary to peel the overcoat layer from the light sensitive layer is measured as the adhesive strength.

The overcoat layer may further contain a surfactant or a matting agent. The overcoat layer is formed, coating on the light sensitive layer a coating liquid in which the above protective layer composition is dissolved in an appropriate coating solvent, and drying. The main solvent of the coating solvent is preferably water or an alcohol solvent such as methanol, ethanol, or iso-propanol.

The thickness of the overcoat layer is preferably 0.1 to 5.0 $\mu$m, and more preferably 0.5 to 3.0 $\mu$m.

Various Additives

The light sensitive planographic printing plate precursor in the invention can contain various additives in addition to the compounds described above, as long as the effects of the invention are not jeopardized.

For example, a polymerization inhibitor can be used in order to prevent undesired polymerization of monomers. Examples of the polymerization inhibitor include hydroquinone, p-methoxyphenol, di-t-butyl-p-cresol, pyrrogallol, t-butylcatechol, benzoquinone, 4,4'-thiobis (3-methyl-6-t-butylphenol), 2,2'-methylenebis (4-methyl-6-t-butylphenol), N-nitrosophenylhydroxylamine cerous salt, and 2-t-butyl-6-(3-t-butyl-6-hydroxy-5-mrthylbenzyl)-4-methylphenyl acrylate.

The polymerization inhibitor content is preferably 0.01 to 5% by weight based on the total solid content of the light sensitive layer of the light sensitive planographic printing plate precursor. Further, in order to prevent polymerization induced by oxygen, a higher fatty acid such as behenic acid or a higher fatty acid derivative such as behenic amide may be added to the layer.

Further, in order to improve the light sensitive layer, the layer can contain an inorganic filler or a plasticizer such as dioctyl phthalate, dimethyl phthalate or tricresyl phosphate. The content of such a material is preferably not more than 10% by weight, based on the total solid content of the light sensitive layer composition.

A colorant can be also used. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran". Pigment is preferred.

Kinds of the pigment include black pigment, yellow pigment, red pigment, brown pigment, violet pigment, blue pigment, green pigment, fluorescent pigment, and metal powder pigment. Examples of the pigment include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment).

Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the photopolymerizable light sensitive layer composition.

Image Formation Method

A method of forming an image on the light sensitive planographic printing plate precursor in the invention comprises imagewise exposing the light sensitive planographic printing plate precursor described above, and developing the exposed plate with a developer described later.

The light sources for forming an image on the light sensitive planographic printing plate precursor of the invention include, for example, a laser, an emission diode, a xenon flush lamp, a halogen lamp, a carbon arc light, a metal halide lamp, a tungsten lamp, a high pressure mercury lamp, and a non-electrode light source.

When the light sensitive planographic printing plate precursor is imagewise exposed at one time, a mask material having a negative image pattern made of a light shielding material is put on the plate to be in close contact with the plate, and exposure is carried out through the mask.

When an array light such as an emission diode array is used or exposure using a halogen lamp, a metal halide lamp or a tungsten lamp is controlled using an optical shutter material such as liquid crystal or PLZT, a digital exposure according to an image signal is possible and preferable. In this case, direct writing is possible without using any mask material.

Developer and Developer Replenisher

The aqueous solution containing an alkali metal-containing compound is preferably a developer, and preferably contains an alkali compound, a surfactant or a development stabilizing agent. The solution may further contain another agent.

The developer will be explained below.

Examples of the alkali metal-containing compound in the invention include potassium silicate, sodium silicate, lithium silicate, potassium metasilicate, sodium metasilicate, lithium metasilicate, potassium phosphate, sodium phosphate, lithium phosphate, potassium hydrogenphosphate, sodium hydrogenphosphate, lithium hydrogenphosphate, potassium carbonate, sodium carbonate, lithium carbonate, potassium hydrogen carbonate, sodium hydrogen carbonate, lithium hydrogen carbonate, potassium borate, sodium borate, and lithium borate. These compounds can be used singly or as a mixture of two or more thereof.

The preferred alkali metal-containing compound is potassium silicate or sodium silicate. The concentration of silicate in the developer is preferably from 1.0 to 3.0% by weight in terms of $SiO_2$ concentration. The ratio by mole ($SiO_2$/M) of $SiO_2$ to alkali metal M is preferably from 0.25 to 2.

The developer may contain organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine, in comnination with the above compound.

The pH of the developer is preferably from more than 8.5 to less than 13.0, and more preferably from more than 8.5 to 12. The developer with a pH of from more than 8.5 to less than 13.0 is preferred in weakness in skin irritation and in ease of handling. Further, the developer with a pH of from more than 8.5 to less than 13.0 provides a printing plate with high printing durability, and high chemical resistance, which shows high resistance at image portions of the printing plate to chemicals such as ink cleaning agent or a plate cleaner.

In order to adjust pH of the developer, sodium hydroxide, potassium hydroxide, ammonium hydroxide and lithium hydroxide can be used.

A developer or developer replenisher used in the invention preferably contains at least one compound selected from silicic acid, phosphoric acid, carbonic acid, phenols, saccharides, and fluorinated alcohols.

Of these, weak acid compounds such as phenols, saccharides, oximes, and fluorinated alcohols have an acid dissociation constant (pKa) of preferably from 10.0 to 13.2.

Such acid compounds are selected from those described in "IONIZATION CONSTANTS OF ORGANIC ACIDS IN AQUEOUS SOLUTION" published by Pergamon Press Co. Ltd. Examples thereof include phenols having a phenolic hydroxyl group such as salicylic acid (pKa: 13.0), 3-hydroxy-2-naphthoic acid (pKa: 12.84), catechol (pKa: 12.6), gallic acid (pKa: 12.4), sulfosalicylic acid (pKa: 11.7), 3,4-dihydroxysulfosalicylic acid (pKa: 12.2), 3,4-dihydroxybenzoic acid (pKa: 11.94), 1,2,4-trihydroxybenzene (pKa: 11.82), hydroquinone (pKa: 11.56), pyrogallol (pKa: 11.34), o-cresol (pKa: 10.33), resorcinol (pKa: 11.27), p-cresol (pKa: 10.27), and m-cresol (pKa: 10.09).

As the saccharides, non-reducing saccharides, which are stable in an alkali solution, are preferably used. The non-reducing saccharides are those which do not have a free aldehyde group or ketone group, and therefore do not have reducibility. They are classified into trehalose type oligosaccharides in which monosaccharides combine with each other through the reducing groups, glycosides in which saccharides combine with another compound through their reducing group, and sugar alcohols obtained by reducing saccharides, each of which can be suitably used in the invention. Examples of the trehalose type oligosaccharide include trehalose and saccharose. Examples of the glycosides include alkyl glycosides, phenol glycosides, and mustard oil glycoside.

Examples of the sugar alcohols include D,L-arabitol, ribitol, xylitol, D,L-sorbitol, D,L-mannitol, D,L-iditol, D,L-talitol, D,L-dulcitol, and D,L-allodulcitol.

Maltitol obtained by hydrogenation of disaccharides or reduced oligosaccharides (reduced starch syrup) obtained by hydrogenation of oligosaccharides are suitably used. Examples of the oximes include 2-butanoneoxime (pKa: 12.45), acetoxime (pKa: 12.42), 1,2-cycloheptanedioxime (pKa: 12.3), 2-hydroxybenzaldehideoxime (pKa: 12.10), dimethylglyoxime (pKa: 12.9), ethanediamidedioxime (pKa: 11.37), acetophenoneoxime (pKa: 11.35). Examples of the fluorinated alcohols include 2,2,3,3-tetrafluoropropanol-1 (pKa: 12.74), trifluoroethanol (pKa: 12.37), and trichloroethanol (pKa: 12.24). Further, aldehydes, nucleic acid related substances or other weak acids are used. Examples of the aldehydes include pyridine-2-aldehyde (pKa: 12.68) and pyridine-4-aldehyde (pKa: 12.05), Examples of the nucleic acid related substances include adenosine (pKa: 12.56), inosine (pKa: 12.5), guanine (pKa: 12.3), cytosine (pKa: 12.2), hypoxanthine (pKa: 12.1), and xanthine (pKa: 11.9). Examples of the other weak acids include diethylaminomethylsulfonic acid (pKa: 12.32), 1-amino-3,3,3-trifluorobenzoic acid (pKa: 12.29), isopropylidenedisulfonic acid (pKa: 12.10), 1,1-ethylidenediphosphonic acid (pKa: 11.54), 1,1-diethylidenedisulfonic acid-1-hydroxy (pKa: 11.52), benzimidazole (pKa: 12.86), thiobenzamide (pKa: 12.8), picolinthioamide (pKa: 12.55), and barbituric acid (pKa: 12.5).

These acid compounds can be used singly or as a mixture of two or more thereof. Of these compounds, silicic acid, phosphoric acid, sulfosalicylic acid, salicylic acid, sugar alcohol, and saccharose are preferred, and silicic acid, D-sorbitol, saccharose, and reduced starch syrup are particularly preferred, since they are inexpensive and show buffering action in appropriate pH regions.

These weak acid compounds are contained in the developer or developer replenisher in an amount of preferably from 0.1 to 30% by weight, and more preferably from 1 to 20% by weight.

The developer in the invention refers to a developer replenished with developer replenisher in development (so-called working developer) as well as fresh developer used at the beginning of development.

The developer replenisher is required to be higher in activity (for example, alkali compound concentration) than the developer, and may have a pH exceeding 13.0.

Surfactant

Various surfactants or organic solvents can be optionally added to a developer or a developer replenisher used in the invention, in order to accelerate development, disperse smuts occurring during development, or enhance ink receptivity at the image portions of a printing plate. Preferred examples of the surfactant include an anionic surfactant, a cationic surfactant, a nonionic surfactant, and an amphoteric surfactant.

Examples of the nonionic surfactant include polyoxyethylenealkyl ethers, polyoxyethylenealkylphenyl ethers, polyoxyethylene-polystyrylphenyl ethers, polyoxyethylene-polyoxypropylenalkyl ethers, partial esters of glycerin and fatty acids, partial esters of sorbitan and fatty acids, partial esters of pentaerythritol and fatty acids, propylene glycol monofatty acid ester, partial esters of sucrose and fatty acids, partial esters of polyoxyethylenesorbitan and fatty acids, partial esters of polyoxyethylenesorbitol and fatty acids, esters of polyoxyethylene glycol and fatty acids, partial esters of polyglycerin and fatty acids, polyoxyethylene castor oil, partial esters of polyoxyethyleneglycerin and fatty acids, polyoxyethylene-polyoxypropylene block copolymer, adduct of polyoxyethylene-polyoxypropylene block copolymer with ethylene imine, fatty acid diethanolamides, N,N-bis-2-hydroxyalkylamines, polyoxyethylenealkylamines, triethanolamine fatty acid esters, and trialkylamine oxides. Examples of the anionic surfactant include fatty acid salts, abietic acid salts, hydroxyalkane sulfonic acid salts, alkane sulfonic acid salts, dialkylsulfosuccinic acid salts, straight-chained alkylbenzene sulfonic acid salts, branched alkylbenzene sulfonic acid salts, alkylnaphthalene sulfonic acid salts, alkyldiphenylether sulfonic acid salts, alkylphenoxy-polyoxyethylenepropyl sulfonic acid salts, polyoxyethylene-alkyl sulfophenylether salts, N-methyl-N-oleiltaurine sodium salts, N-alkylsulfosuccinic acid monoamide disodium salts, petroleum sulfonic acid salts, nitrated castor oil, sulfated beef tallow, fatty acid alkyl ester sulfate salts, alkylsulfate salts, polyoxyethylenealkylethersulfate salts, fatty acid monoglyceride sulfate salts, polyoxyethylenealkylphenylethersulfate salts, polyoxyethylenestyrylphenylethersulfate salts, alkylphosphate salts, polyoxyethylenealkyletherphosphate salts, polyoxyethylenealkylphenyletherphosphate salts, partial saponification products of styrene-maleic anhydride copolymers, partial saponification products of olefin-maleic anhydride copolymers, and condensates of naphthalene sulfonic acid salts with formalin. Examples of the cationic surfactant include alkylamine salts, quaternary ammonium salts such as tetrabutylammonium bromide, polyoxyethylene alkylamine salts, and polyethylene polyamine derivatives. Examples of the amphoteric surfactant include carboxybetains, aminn carboxylic acids, sulfobetaines, aminosulfates and imidazolines. The "polyoxyethylene" described above can be replaced with polyoxyalkylene such as polyoxymethylene, polyoxypropylene, or polyoxybutylene. A more preferred surfactant is a fluorine-containing surfactant having a perfluoroalkyl group in the molecule. Examples thereof include anionic surfactants such as perfluoroalkylcarboxilic acid salts, or perfluoroalkylsurfuric acid salts, amphoteric surfactants such as perfluorobetaines, cationic surfactants such as perfluoroalkyltrimethylammonimum chlorides, and nonionic surfactants such as perfluoroalkylamineoxides, perfluoroalkylethyleneoxide adducts, oligomers having a perfluoroalkyl group and a hydrophilic group, oligomers having a perfluoroalkyl group and an oleophilic group, oligomers having a perfluoroalkyl group, a hydrophilic group, and an oleophilic group, and urethanes having a perfluoroalkyl group and an oleophilic group.

These surfactants can be used singly or as a mixture of two or more thereof. The developer preferably contains the surfactant in an amount of preferably from 0.001 to 5% by weight.

Development Stabilizing Agent

The developer or developer replenisher used in the invention preferably contains a development stabilizing agent. The preferred examples of the development stabilizing agent include an adduct of sugar alcohol with polyethylene glycol, tetraalkylammonium hydroxide such as tetrabutylammonium hydroxide, a phosphonium salt such as tetrabutylphosphonium bromide, and an iodonium salt such as diphenyliodonium chloride, as disclosed in Japanese Patent O.P.I. Publication No. 6-282079. Examples of the development stabilizing agent include anionic surfactants or amphoteric surfactants disclosed in Japanese Patent O.P.I. Publication No. 50-51324, water soluble cationic polymers disclosed in Japanese Patent O.P.I. Publication No. 55-95946, and water soluble amphoteric surfactants disclosed in Japanese Patent O.P.I. Publication No. 56-142528. Further, the examples include organic boron-containing compound to which alkylene glycol is added, disclosed in Japanese Patent O.P.I. Publication No.59-84241, polyoxyethylene-polyoxypropylene block polymer type water-soluble surfactant, disclosed in Japanese Patent O.P.I. Publication No.60-111264, an alkylenediamine compound having polyoxyethylene-polyoxypropylene, disclosed in Japanese Patent O.P.I. Publication No.60-129750, polyoxyethylene, glycol with an average weight molecular weight of not less than 300 disclosed in Japanese Patent O.P.I. Publication No.61-215554, a fluorine-containing surfactant having a cationic group disclosed in Japanese Patent O.P.I. Publication No.63-175858, and a water soluble ethyleneoxide adduct obtained by adding ethyleneoxy to an acid or an alcohol, or water soluble polyalkylenes disclosed in Japanese Patent O.P.I. Publication No.2-39157.

Organic Solvent

Organic solvents are optionally added to a developer or a developer replenisher. The organic solvent is a solvent having a solubility in water of suitably 10 weight % or less, and preferably 5 weight % or less. Examples of the organic solvent include 1-phenylethanol, 2-phenylethanol, 3-phenyl-1-propanol, 4-phenyl-1-butanol, 1-phenyl-2-butanol, 2-phonoxyethanol, 2-benzyloxyethanol, o-methoxybenzylalcohol, m-methoxybenzylalcohol, p-methoxybenzylalcohol, benzylalcohol, cyclohexanol, 2-methylcyclohexanol, 3-methylcyclohexanol, 4-methylcyclohexanol, N-phenylethanolamine, and N-phenyldiethanolamine.

The organic solvent content of the working developer is preferably 0.1 to 5 weight %. It is preferred that the organic solvent content is not substantially contained in the developer or developer replenisher. The term "not substantially contained" means that the organic solvent is contained in an amount of not more than 1% by weight.

Reducing Agent

A reducing agent is optionally added to the developer or developer replenisher used in the invention. This is added in order to prevent occurrence of stains on the printing plate during printing. The addition is particularly effective in developing a negative working light sensitive planographic printing plate precursor comprising a light sensitive diazonium compound. Preferred examples of the reducing agent include a phenolic compound such as thiosalicylic acid, hydroquinone, metol, methoxyquinone, resorcine, or 2-methylresorcine, and an amine compound such as phenylenediamine or phenylhydrazine.

Preferred examples of the inorganic reducing agent include a sodium, potassium or ammonium salt of an inorganic acid such as sodium sulfite, potassium sulfite, ammonium sulfite, sodium phosphite, potassium phosphite, ammonium phosphite, sodium hydrogen phosphite, potassium hydrogen phosphite, ammonium hydrogen phosphite, sodium thiosulfate, potassium thiosulfate, ammonium thiosulfate, sodium dithionite, potassium dithionite, ammonium dithionite. It is sulfite of these that shows excellent anti-staining effect. The reducing agent content of the developer is preferably 0.05 to 5% by weight.

Organic Carboxylic Acid

An organic carboxylic acid is optionally added to the developer or developer replenisher used in the invention. Preferred organic carboxylic acids include an aliphatic carboxylic acid or an aromatic carboxylic acid each having a carbon atom number of from 6 to 20.

Examples of the aliphatic carboxylic acid include caproic acid, enanthic acid, caprylic acid, lauric acid, myristic acid, palmitic acid, and stearic acid. Particularly preferred are alkanoic acids having a carbon atom number of from 8 to 12. The acid may be an unsaturated acid having a double bond in the molecule or may have a branched carbon chain. The aromatic carboxylic acid is an aromatic compound such as benzene, naphthalene or anthracene having a carboxyl group. Examples of the aromatic carboxylic acid include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, and 2-naphthoic acid. Hydroxy naphthoic acids are especially preferred. These carboxylic acid are preferably used in the salt form, for example as the sodium salts, potassium salts or ammonium salts, in order to increase their water solubility.

The carboxylic acid content of the developer is not specifically limited, and is preferably from 0.1 to 10% by weight, and more preferably from 0.5 to 4% by weight.

Other Additives

The developer or developer replenisher in the invention may contain the following additives in order to increase development performance. Examples of the additives include a neutral salt such as sodium chloride, potassium chloride, potassium bromide, as dislosed in Japanese Patent O.P.I. Publication No. 58-75152, a complex such as [Co(NH$_3$)$_6$]Cl$_3$ as dislosed in Japanese Patent O.P.I. Publication No. 59-121336, an amphoteric polymer such as a copolymer of vinylbenzyltrimethylammonium chloride and sodium acrylate as disclosed in Japanese Patent O.P.I. Publication No. 56-142258, the organic metal containing surfactant containing Si or Ti as disclosed in Japanese Patent O.P.I. Publication No. 59-75255, and the organic boron containing compound disclosed in Japanese Patent O.P.I. Publication No. 59-84241. The developer or developer replenisher in the invention can further contain an antiseptic agent, a coloring agent, a viscosity increasing agent, an antifoaming agent, or a water softener. Examples of the antifoaming agent include mineral oil, vegetable oil, alcohols, surfactants, and silicon oil. The water softeners include polyphosphoric acid or its sodium, potassium or ammonium salt; aminopolycarboxylic acids or their salts such as ethylenediaminetetraacetic acid or its sodium, potassium or ammonium salt, diethylenetriaminepentaacetic acid or its sodium, potassium or ammonium salt, triethylenetetraminehexaacetic acid or its sodium, potassium or ammonium salt, hydroxyethylethylenediaminetriacetic acid or its sodium, potassium or ammonium salt, nitrilotriacetic acid or its sodium, potassium or ammonium salt, 1,2-diaminocyclohexane-tetraacetic acid or its sodium, potassium or ammonium salt, 1,3-diamino-2-propanoltetraacetic acid or its sodium, potassium or ammonium salt; and phosphonic acids or their salts such as aminotri(methylenephosphonic acid) or its sodium, potassium or ammonium salt, ethylenediaminetetra (methylenephosphonic acid) or its sodium, potassium or ammonium salt, diethylenetriaminepenta (methylenephosphonic acid) or its sodium, potassium or ammonium salt, triethylenetetraminehexa (methylenephosphonic acid) or its sodium, potassium or ammonium salt, hydroxyethylethylenediaminetri (methylenephosphonic acid) or its sodium, potassium or ammonium salt, and 1-hydroxyethane-1,1-diphosphonic acid or its sodium, potassium or ammonium salt.

The water softener content of the developer varies on hardness or amount of a hard water used, but the content is preferably 0.01 to 5 weight %, and more preferably 0.01 to 0.5 weight %.

Concentrated Solution

The developer or developer replenisher used in the invention is an aqueous concentrated solution with a low water content, which is diluted with water and used for development. The aqueous concentrated solution is advantageous in view of its transport. The degree of concentration of the concentrated solution is such that the components contained in the solution are not separated nor precipitated. The concentrated solution may contain a solubilizing agent. As the solubilizing agent is preferred so-called a hydrotrope such as toluene sulfonic acid, xylene sulfonic acid, or their alkali metal salt, which is disclosed in Japanese Patent O.P.I. Publication Nos. 6-32081.

Automatic Developing Machine

Figure 1:
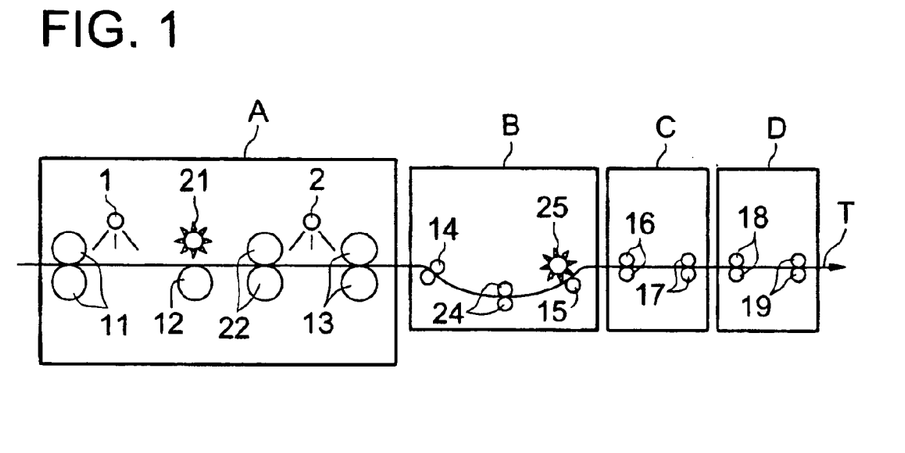
FIG. 1 shows a schematic view of an automatic developing machine for processing a light sensitive planographic printing plate precursor.

The automatic developing machine used in the invention is preferably one which has the structure as illustrated in FIG. 1.

In FIG. 1, symbol "A" represents a pre-washing section, symbol "B" a development section, symbol "C" post-washing section, symbol "D" a post-processing section, and symbol "T" a light sensitive planographic printing plate precursor transporting path. Numerical numbers 11, 12, 13, 14, 15, 16, 17, 18, and 19 represent transporting rollers, numerical numbers 1 and 2 represent a washing water supply means 1 (also referred to as a spray 1) and a washing water supply means 2 (also referred to as a spray 2), respectively, numerical number 21 represents a brush, numerical number 22 represents a squeegee roller, numerical number 24 represents a squeeze roller, and numerical number 25 represents a brush for development.

An exposed light sensitive planographic printing plate precursor introduced in the automatic developing machine is pre-washed with washing water at the pre-washing section A, developed with a developer at the development section B, post-washed with a washing water, and then post-processed at the post-processed section D to prepare a planographic printing plate.

It is preferred that a means for replenishing a developer replenisher in a necessary amount, a means for discharging any excessive developer, or a means for automatically replenishing water in necessary amounts is attached to the development section B. It is preferred that the automatic developing machine comprises a means for detecting a transported planographic printing plate precursor, a means for calculating the area of the planographic printing plate precursor based on the detection, or a means for controlling the replenishing amount of a developer replenisher, the replenishing amount of water to be replenished, or the replenishing timing. It is also preferred that the automatic developing machine comprises a means for detecting a pH, temperature and/or electric conductivity of a developer, or a means for controlling the replenishing amount of the developer replenisher, the replenishing amount of water to be replenished or the replenishing timing, based on the detection.

The automatic developing machine used in the invention has a pre-washing tank in which a light sensitive planographic printing plate precursor (hereinafter also referred to as simply a printing plate precursor) is immersed or a spray for spraying water onto the surface of a printing plate precursor as a pre-washing means upstream the developing means. The pre-washing means is preferably a spray for spraying washing water onto a printing plate precursor, more preferably has a means for controlling the temperature of the washing water to fall within the range of 25 to 55° C., and still more preferably a means for brushing the surface of the printing plate precursor, which is a brush in the roll form. As the washing water, common water is preferably used.

Pre-washing Step

In the invention, a light sensitive planographic printing plate precursor is imagewise exposed, pre-washed with a washing water, and developed, wherein in the pre-washing step the exposed precursor is first washed with used water which has been used at least one time for washing the printing plate precursor, and then washed with fresh water which has not been used before.

It is preferred that a light sensitive planographic printing plate precursor is imagewise exposed, pre-washed with a pre-washing water, developed, and further post-washed with a post-washing water wherein in the post-washing step the developed precursor is washed employing a part of the pre-washing water which has been used in the pre-washing step.

For example, in an automatic developing machine having a countercurrent wash structure of a first washing tank, a second washing tank and a third washing tank (in which a planographic printing plate precursor is transported to the tanks in that order, and when fresh water is supplied to the third washing tank, excessive water used for washing overflows in the second washing tank and the first washing tank in that order), "used water which has been used at least one time for washing" above means washing water in the second and first tanks. In this case, the washing water of the second and third washing tanks enters the first washing tank due to the countercurrent wash structure, and therefore the washing water in the first tank is used water which has been used at least one time for washing. This embodiment is preferred in the invention. For example, in an automatic developing machine having a single washing tank with washing water, when the washing water is re-circulated and used for washing a printing plate precursor, the re-circulated water is also used water which has been used at least one time for washing. This embodiment is also preferred in the invention. The fresh water is preferably tap water. In the above, the fresh water, which has been used for washing, is replenished to the used water which has been used at least one time for washing, and all of the fresh water, which has been used for washing, are more preferably replenished to the used water which has been used at least one time for washing. The fresh water or the used water as described above is supplied onto the surface of the exposed or developed planographic printing plate precursor through a spray. The temperature of the water used for washing is preferably from 15 to 65° C. and more preferably from 25 to 55° C.

In the pre-washing step, a brush in the roller form can be used in order to scrape the oxygen-shielding layer of the planographic printing plate precursor and accelerate removal of the oxygen-shielding layer. The step using the brush is not specifically limited. However, when a first step of washing with circulated water is carried out, followed by a second step of washing with fresh water, the brush-using step is preferably a step between the first and second washing steps. Use of the brush before the first washing step reduces scraping effect of the layer, since washing water is not yet supplied. Use of the brush after the second washing step also reduces scraping effect of the layer since foreign matter produced due to brush scraping is not washed away.

Supply of the re-circulated water or fresh water onto the surface of a printing plate precursor may be carried out using a spray.

The used water, which has been used at least one time for washing, is supplied to the planographic printing plate precursor in an amount of preferably from 0.5 to 20 l/m², and more preferably from 1 to 5 l/m². The fresh water is supplied to the planographic printing plate precursor in an amount of preferably from 0.3 to 3 l/m², and more preferably from 0.5 to 2 l/m².

Post-washing Step

It is preferred in the invention that a light sensitive planographic printing plate precursor is imagewise exposed, pre-washed with a pre-washing water, developed, and further post-washed with a post-washing water wherein in the post-washing step the developed precursor is washed with a part of the pre-washing water which has been used in the pre-washing step.

This process increases supplying amount of fresh water in the pre-washing step and attains the desired pre-washing effects. The total amount of washing water used in the pre-washing and post-washing steps in this process is identical to or less than that used in a conventional process. Accordingly, this process can reduce waste water.

The present inventors have carried out various experiments, and as a result, they have found the following results described below, and have completed the invention.

When post-washing water, which contains pre-washing water which has been used in a pre-washing step, is used for washing a developed planographic printing plate precursor, the desired effects of the invention are obtained. In contrast, when post-washing water is used for washing an exposed planographic printing plate precursor in the pre-washing step, or a mixture of pre-washing water and post-washing water is used in the pre-washing and post-washing steps, the desired effects of the invention are lowered.

Accordingly, it is preferred that a light sensitive planographic printing plate precursor is imagewise exposed, pre-washed with pre-washing water, developed, and further post-washed with post-washing water wherein in the post-washing step the developed precursor is washed with a part of the pre-washing water which has been used in the pre-washing step.

As the post-washing step in the invention, the following can be preferably used.

After the development step, a first washing step employing used water circulated and a second washing step employing fresh water are carried out in that order. In this case, between the first and second washing steps, another washing step employing used water circulated or another second washing step employing fresh water may be inserted.

Washing water used in each of the above washing steps may contain an additive. Examples of the additive include an antiseptic agent, a surfactant, and a chelating agent as disclosed in Japanese Patent O.P.I. Publication No. 2001-281872.

A method disclosed in Japanese Patent O.P.I. Publication No. 2001-281872 can be used in which when an oxygen-shielding layer containing an additive is washed in a pre-washing step, the additive is dissolved in the washing water, whereby the washing water contains the additive.

Post-processing Step

The developed planographic printing plate precursor is preferably subjected to post-processing. The post-processing step comprises post-processing the developed precursor with a post-processing solution such as washing water, a rinsing solution containing a surfactant, a finisher or a protective gumming solution containing gum arabic or starch derivatives as a main component.

The post-processing step is carried out employing an appropriate combination of the post-processing solution described above. For example, a method is preferred in which a developed planographic printing plate precursor is post-washed with washing water, and then processed with a rinsing solution containing a surfactant, or a developed planographic printing plate precursor is post-washed with washing water, and then processed with a finisher, since it reduces fatigue of the rinsing solution or the finisher. It is preferred that a multi-step countercurrent processing is carried out employing a rinsing solution or a finisher. The post-processing is carried out employing an automatic developing machine having a development section and a post-processing section.

In the post-processing step, the developed printing plate is sprayed with the post-processing solution from a spray nozzle or is immersed into the post-processing solution in a post-processing tank.

A method is known in which supplies a small amount of water onto the developed printing plate precursor to wash the precursor, and reuses the water used for washing as a dilution water of a concentrated developer. In the automatic developing machine, a method is applied in which each processing solution is replenished with the respective processing replenisher according to the area of the printing plate precursor to have been processed or the operating time of the machine. A method (use-and-discard method) can be applied in which the developed precursor is processed with fresh processing solution and discarded.

The thus obtained planographic printing plate is mounted on a printing.press, and printing is carried out.

EXAMPLES

Next, the present invention will be explained employing examples, but the present invention is not limited thereto. In the examples, "parts" represents "parts by weight", unless otherwise specified.

Synthesis of Polymer Binder 1

Twelve parts of methacrylic acid, 70 parts of methyl methacrylate, 8 parts of acrylonitrile, 10 parts of ethyl methacrylate, 500 parts of ethanol, and 3 parts of α, α'-azobisisobutylonitrile were put in a three neck flask under nitrogen atmosphere, and reacted under nitrogen atmosphere for 6 hours at 80° C. in an oil bath. Thus, polymer binder 1 was obtained. The weight average molecular weight of the polymer binder 1 was 45,000, measured according to GPC.

Synthesis of Polymer Binder 2

Twelve parts of methacrylic acid, 70 parts of methyl methacrylate, 8 parts of acrylonitrile, 10 parts of ethyl methacrylate, 500 parts of ethanol, and 3 parts of α,α'-azobisisobutylonitrile were put in a three neck flask under nitrogen atmosphere, and reacted under nitrogen atmosphere for 6 hours at 80° C. in an oil bath. After that, 3 parts of triethylammonium chloride and 2 parts of glycidyl methacrylate were added to the resulting reaction mixture, and further reacted for 3 hours. Thus, polymer binder 2 was obtained. The weight average molecular weight of the polymer binder 2 was 50,000, measured according to GPC. The glass transition temperature Tg of the polymer binder 2 was 85° C., measured according to DSC (differential thermal analysis).

Preparation of Support

A 0.24 mm thick aluminum plate (material 1050, quality H16) was degreased at 60° C. for one minute in a 5% sodium hydroxide solution, washed with water, immersed at 250° C. for one minute in 10% hydrochloric acid solution to neutralize, and then washed with water. The resulting aluminum plate was electrolytically etched using an alternating current at 25° C. for 60 seconds at a current density of 100 A/dm$^2$ in a 0.3 weight % nitric acid solution, desmut at 60° C. for 10 seconds in a 5% sodium hydroxide solution. The desmut aluminum plate was anodized at 25° C. for 1 minute at a current density of 10 A/dm$^2$ and at a voltage of 15 V in a 15% sulfuric acid solution. Thus, support 1 was obtained. The center line average surface roughness of the support was 0.65 μm.

Coating of Subbing Layer on the Support

The following subbing layer coating liquid was coated on the support obtained above using a wire bar, dried at 90° C. for one minute, and further heated at 110° C. for 3 minutes to give a subbing layer with a dry thickness of 0.1 g/m$^2$. Thus, subbed support was obtained.

Subbing Layer Coating Liquid

| | |
|---|---|
| γ-Methacryloxypropyltrimethoxysilane | 1 part |
| Methyl ethyl ketone | 80 parts |
| Cyclohexanone | 19 parts |

Preparation of Light Sensitive Planographic Printing Plate Precursor

The following photopolymerizable light sensitive layer coating liquid was coated on the subbed support using a wire bar, and dried at 95° C. for 1.5 minutes to give a light sensitive layer with a dry thickness of 1.4 g/m$^2$. After that, the following overcoat layer coating liquid was coated on the light sensitive layer of the resulting plate using an applicator, and dried at 75° C. for 1.5 minutes to give an oxygen shielding layer with a dry thickness of 2.0 g/m$^2$. Thus, a light sensitive planographic printing plate precursor was prepared.

Photopolymerizable Light Sensitive Layer Coating Liquid

| | |
|---|---|
| Polymer binder | 35 parts |
| Dye 1 described later | 4.0 parts |
| Dye 2 described later | 4.0 parts |
| Monomer 1 | 10 parts |
| Monomer 2 | 10 parts |
| Monomer 3 | 20 parts |
| Monomer 4 | 10 parts |
| Phthalocyanine pigment | 6.0 parts |
| (MHI 454 produced by Mikuni Sikisosha) | |
| 2-t-butyl-6-(3-t-butyl-2-hydroxy-5-methylbenzyl)-4-methylphenyl acrylate | 0.5 parts |
| (Sumirizer GS produced by Sumitomo 3M Co., Ltd.) | |
| Fluorine-contained surfactant | 0.5 parts |
| (FC-431 produced by Sumitomo 3M Co., Ltd.) | |
| Methyl ethyl ketone (bp. 79.6° C.) | 80 parts |
| Cyclopentanone (bp. 129° C.) | 820 parts |

The monomers 1 through 4 (ethylenic addition polymerizable group-containing compounds) described above are as follows:

Monomer 1: EO modified tris(acryloxyethyl)isocyanuric acid (ARONIX M-315, produced by Toa Gosei Co., Ltd.)

Monomer 2: Polytetramethylene glycol diacrylate (PTMGA-250, produced by Kyoeisha Chemical Co., Ltd.)

Monomer 3: polyfunctional urethane acrylate (U-4HA, produced by Shin Nakamura Kagaku Kogyo Co., Ltd.)

Monomer 4: 2-methacryloyloxy ethyl acid phosphate (LIGHT-ESTER P-2M, produced by Kyoeisha Chemical Co., Ltd.)

Monomer: Addition polymerizable monomer having an ethylenic double bond

Dye 1

Dye 2

Overcoat Layer Coating Liquid

Polyvinyl alcohol amount shown in Table 1 (GL-03 produced by Nippon Gosei Kagaku Co., Ltd.)

Polyvinyl pyrrolidone amount shown in Table 1 (K-30 produced by Tokyo Kasei Co., Ltd.)

Surfactant 0.5 parts (F142D produced by Dainippon Ink Kagaku Kogyo Co., Ltd.)

Water 900 parts

The thus obtained photopolymerization type light sensitive planographic printing plate precursor with a size of 1003 mm×800 mm was imagewise exposed at a resolving degree of 2540 dpi (dpi represents the dot numbers per 2.54 cm) employing a CTP exposure apparatus (Tigercat produced by ECRM Co., Ltd.) installed with a FD-YAG laser source. The exposed printing plate precursor was developed employing a CTP automatic developing machine (PHW 23-V produced by Technicagraph Co., Ltd.), which had the structure as shown in FIG. 1. The developing machine comprised a pre-washing section A for removing the overcoat layer before development comprising spray 1 and spray 2, a development section B comprising a developer tank charged with a developer having the following composition, a post-washing section C for removing the developer remaining on the developed plate after development, and a post-processing section D comprising a gumming tank charged with a gumming solution (a solution obtained by diluting GW-3, produced by Mitsubishi Chemical Co., Ltd., with water by a factor of 2) for protecting the surface of the developed plate. In the above pre-washing section, the exposed printing plate precursor was first washed through a spray 1, and then through a spray 2. Processing conditions in each section are shown in Table 1. Thus, planographic printing plate sample Nos. 1 through 5 with a size of 1003 mm×800 mm were obtained.

Developer Composition

| | |
|---|---|
| Potassium silicate A (an aqueous potassium silicate solution containing 26.5% by weight of $SiO_2$ and 13.5% by weight of $K_2O$) | 80 g |
| PELEX NBL produced by Kao Co., Ltd. | 30 g |
| Ethylenediaminetetraacetic acid disodium salt | 0.5 g |
| Potassium hydroxide | Amount giving pH 12.2 |
| Water | 1 liter |

Evaluation

<Developability>

The planographic printing plate sample, obtained after 500 m² of the printing plate precursor were processed as above, was mounted on a printing machine (DAIYA1F-1 produced by Mitsubishi Jukogyo Co., Ltd.), and printing was carried out wherein a coated paper, dampening water (Etch Solution SG-51 (concentration 1.5%) produced by Tokyo Ink Co., Ltd.) and printing ink (Hyplus M magenta produced by Toyo Ink Manufacturing Co., Ltd.) were used.

Thus, one hundred prints were obtained, and the non-image portions of the one hundredth print were evaluated according to the following criteria:

A: No ink staining was observed at the non-image portions.

B: Ink staining was visually observed at the non-image portions.

<Peppering, Spots Produced on the Support After Printing Was Started, Stopped During a Predetermined Interval, and Then Resumed>

Employing the printing plate above amounted on the printing machine, further printing was carried out in the same manner as above. After five thousand sheets of coated paper were printed, printing was stopped for 1 hour, and then printing was resumed to obtain one hundred prints. The number of peppering was counted per 100 cm² (10 cm×10 cm) of non-image portions of the one hundredth print after the resumption of a print run and evaluated according to the following criteria:

Peppering of not more than 10 are excellent, peppering of from more than 10 to less than 30 can be put in practical use, and peppering exceeding 30 are problematic for practical use.

<Sludge>

The photopolymerization type light sensitive planographic printing plate precursor obtained above was exposed to give an area ratio of image portion area to non-image portion area being 1:9, and developed. Thus, 3000 m² of the printing plate precursor were processed. Herein, an automatic developing machine PHW32-V, produced by Technigraph Co., Ltd., was employed, and the printing plate precursor was processed, while developer replenisher was replenished to a developer at a rate of 100 ml per m² of the printing plate precursor to be processed. After the processing, sludge occurred in the developer tank of the developing machine was visually observed, and evaluated according to the following criteria:

A: Only slight sludge was produced.

B: Sludge was produced, and the pump for supplying a developer did not work due to the sludge, or the sludge was adhered to the resulting printing plate, producing staining.

The results are shown in Table 1.

TABLE 1

| Sample No. | Pre-washing step | | Water amount supplied with spray 2 (lit./m²) | Fresh water supplying amount at post-washing step (lit./m²) | Use of pre-washing water at post-washing step after development | Peppering | Developability | Sludge occurrence |
|---|---|---|---|---|---|---|---|---|
| | Spray 1 | Spray 2 | | | | | | |
| 1 (Inv.) | Re-circd. water | Fresh water | 0.5 | 0.5 | No | 19 | A | A |
| 2 (Inv.) | Re-circd. water | Fresh water | 0.5 | 0.0 | Yes | 16 | A | A |
| 3 (Inv.) | Re-circd. water | Fresh water | 1.0 | 0.5 | No | 12 | A | A |
| 4 (Inv.) | Re-circd. water | Fresh water | 1.0 | 0.0 | Yes | 13 | A | A |
| 5 (Comp.) | Re-circd. water | Re-circd. water | 0.5 | 0.5 | No | 35 | B | B |

Inv. Inventive,
Comp. Comparative,
Re-circd. water Re-circulated water
Inv. Inventive,
Comp. Comparative

Effect of the Invention

The present invention provides a light sensitive planographic printing plate precursor processing method of providing a planographic printing plate which prevents peppering from ocurring at non-image portions of the printing plate, when printing is started employing the printing plate, suspended on account of registering or a break, and then resumed, and further provides a light sensitive planographic printing plate precursor processing method of reducing sludge produced in a developing tank during processing and lightening cleaning load of the developer tank.

What is claimed is:

1. A method of processing a light sensitive planographic printing plate precursor containing a support, and provided thereon, a photopolymerizable light sensitive layer and an overcoat layer in that order, the photopolymerizable light sensitive layer containing a compound having an ethylenic addition polymerizable group, a photo-initiator and a polymer binder, the method comprising the steps of:

imagewise exposing the light sensitive planographic printing plate precursor;

pre-washing the exposed light sensitive planographic printing plate precursor with washing water; and developing the pre-washed light sensitive planographic printing plate precursor with a developer containing an alkali metal-containing compound, wherein the pre-washing step comprises first washing the exposed light sensitive planographic printing plate precursor with a first water being water which has been used at least one time for washing the exposed light sensitive planographic printing plate precursor, and then washing the resulting precursor with a second water being fresh water which has not been used before for washing the exposed light sensitive planographic printing plate precursor.

2. The method of claim 1, further comprising the step of post-washing the developed light sensitive planographic printing plate precursor with post-washing water, wherein the post-washing water comprises a part of washing water used in the pre-washing step.

3. The method of claim 1, wherein the first water is re-circulated and supplied onto the surface of the printing plate precursor through a spray, and the second water is supplied onto the surface of the printing plate precursor through a spray.

4. The method of claim 3, wherein the amount of the first water to be supplied onto the surface of the printing plate precursor is from 0.5 to 20 liters per $m^2$ of the printing plate precursor, and the second water is supplied onto the surface of the printing plate precursor from 0.5 to 3 liters per $m^2$ of the printing plate precursor.

5. The method of claim 1, wherein in the pre-washing step the second water is replenished with all of the second water, which has been used for washing the light sensitive planographic printing plate precursor.

6. The method of claim 1, further comprising the step of rubbing the surface of the first washed light sensitive planographic printing plate precursor with a brush between the first water washing step and the second water washing step.

7. The method of claim 1, wherein the temperature of the first water and the second water is from 15 to 65° C.

8. The method of claim 1, wherein the overcoat layer contains polyvinyl alcohol or polyvinyl pyrrolidone.

9. The method of claim 1, wherein the alkali metal containing compound is potassium silicate, sodium silicate, lithium silicate, potassium metasilicate, sodium metasilicate, lithium metasilicate, potassium phosphate, sodium phosphate, lithium phosphate, potassium hydrogenphosphate, sodium hydrogenphosphate, lithium hydrogenphosphate, potassium carbonate, sodium carbonate, lithium carbonate, potassium hydrogen carbonate, sodium hydrogen carbonate, lithium hydrogen carbonate, potassium borate, sodium borate, or lithium borate.

10. The method of claim 9, wherein the alkali metal containing compound is potassium silicate or sodium silicate.

11. The method of claim 10, wherein the concentration of silicate in the developer is from 1.0 to 3.0% by weight in terms of $SiO_2$ concetration.

12. The method of claim 1, wherein the pH of the developer is from more than 8.5 to less than 13.0.

13. The method of claim 1, wherein the developer further contains a weak acid having an acid dissociation constant of from 10.0 to 13.2.

14. The method of claim 1, wherein in the pre-washing step the second water is tap water.

* * * * *